United States Patent [19]

Glica et al.

[11] Patent Number: 5,262,689
[45] Date of Patent: Nov. 16, 1993

[54] BIMOS CURRENT DRIVER CIRCUIT

[75] Inventors: Stephen J. Glica, Somerset; Raymond L. Giordano, Flemington, both of N.J.

[73] Assignee: Harris Corporation, Melbourne, Fla.

[21] Appl. No.: 781,626

[22] Filed: Oct. 24, 1991

[51] Int. Cl.⁵ ............................................ H03K 17/16
[52] U.S. Cl. .................................... 307/570; 307/254; 307/270; 307/296.7
[58] Field of Search ............... 307/446, 570, 254, 270, 307/296.7; 361/82, 84, 101

[56] References Cited

U.S. PATENT DOCUMENTS

| | | | |
|---|---|---|---|
| 4,220,877 | 9/1980 | Giordano | 307/254 X |
| 4,319,181 | 3/1982 | Wrathall | 307/296.7 X |
| 4,585,962 | 4/1986 | Sasayama | 307/570 |
| 4,609,832 | 9/1986 | Mehl | 307/270 |
| 4,713,560 | 12/1987 | Herndon | 307/570 X |
| 4,924,344 | 5/1990 | Guajando | 361/101 |
| 5,023,493 | 6/1991 | Wrzesinski | 307/570 |
| 5,124,580 | 6/1992 | Matthews et al. | 307/446 |
| 5,128,562 | 7/1992 | Bunton | 307/446 X |

*Primary Examiner*—David Hudspeth
*Attorney, Agent, or Firm*—Charles C. Krawczyk; Ferdinand M. Romano; Brian S. Steinberger

[57] ABSTRACT

A first IGFET and a first bipolar transistor are connected in series between a first power terminal and a first load terminal. A second IGFET and a second bipolar transistor are connected in series between a second load terminal and a second power terminal. the first and second IGFETs are biased to pass the same load current. The first and second bipolar transistors are selectively turned on at the same time to permit current flow via a load which may be connected between the first and second terminals. When the first and second bipolar transistors are turned-off, they prevent conduction (except for leakage) between the load terminals and the first and second power terminals, if and when the voltage at the load terminal goes positive and/or negative. The circuit also includes means for compensating for the base current of the first and second bipolar transistors.

11 Claims, 4 Drawing Sheets

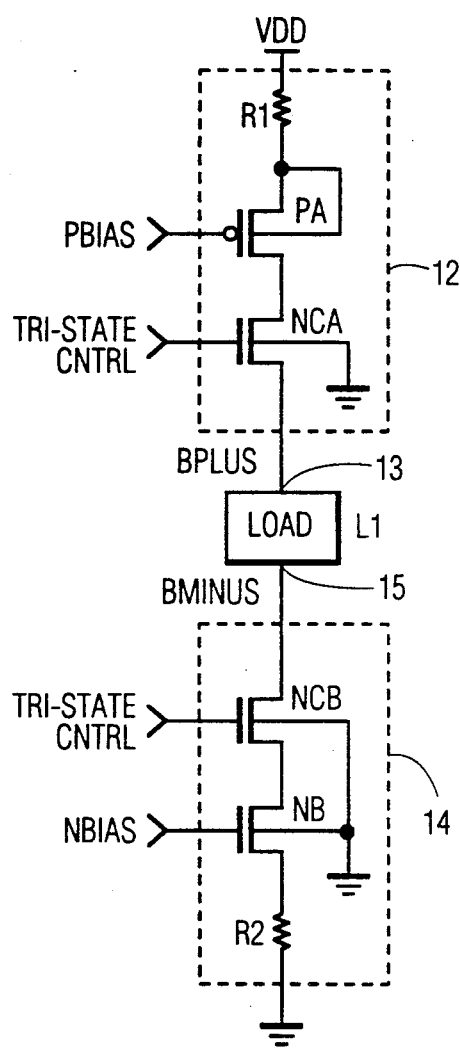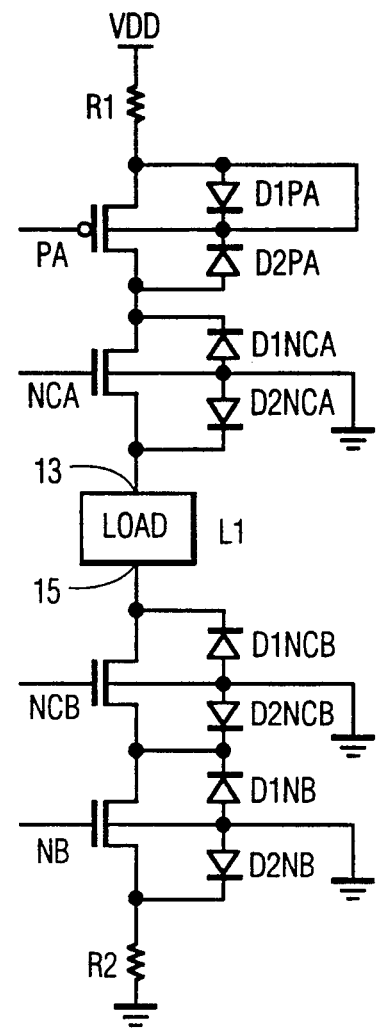
FIG. 1A
PRIOR ART
FIG. 1B
PRIOR ART

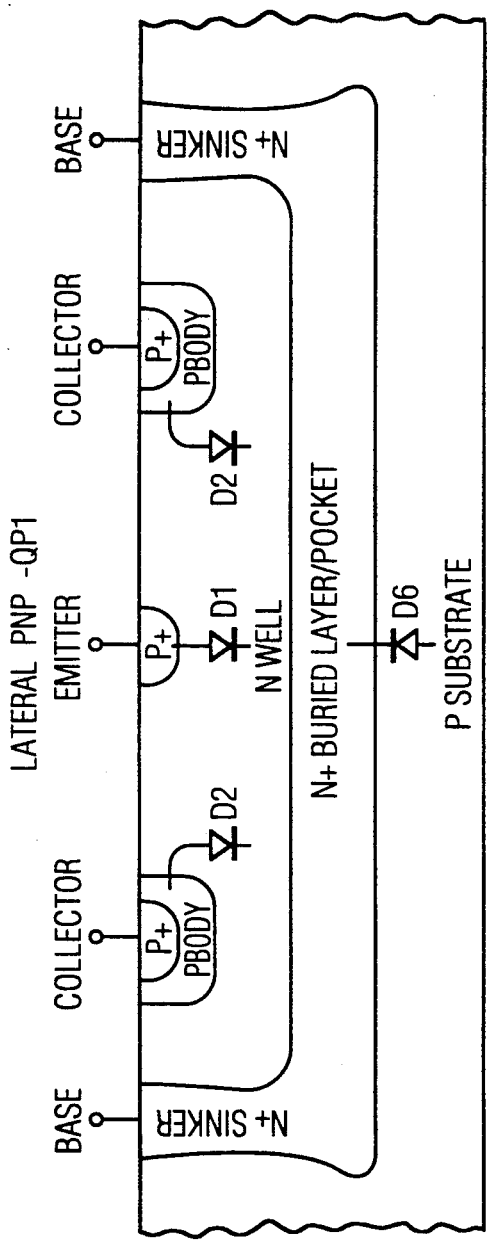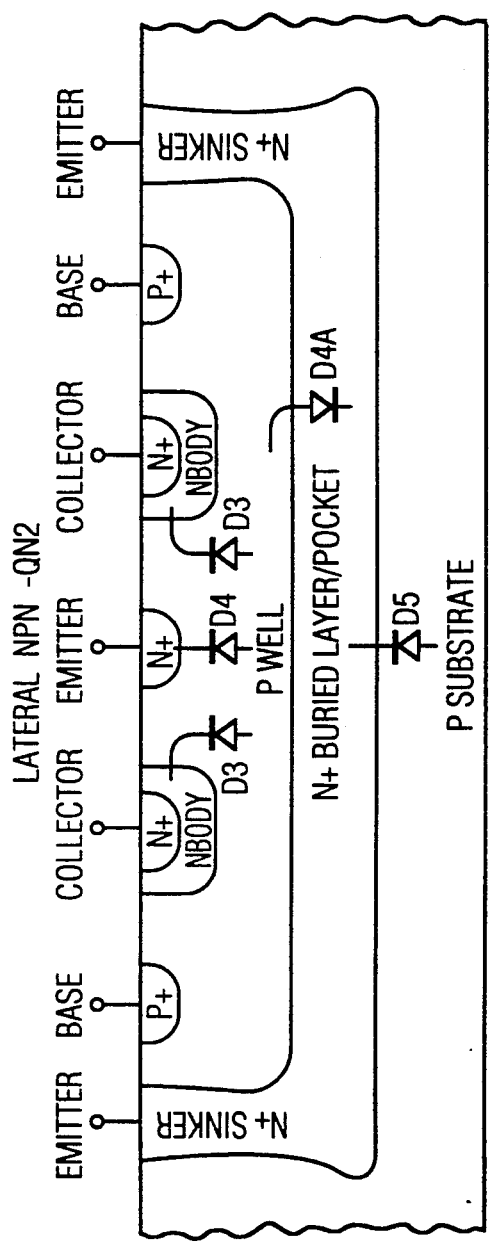

BIMOS CURRENT DRIVER CIRCUIT

BACKGROUND OF THE INVENTION

This invention relates to means for supplying matched source and sink currents to a load.

In many applications, it is necessary to drive a load by supplying a current to the load and drawing a like current from the load. A prior art circuit for performing this function is shown in FIG. 1A. The circuit includes a current sourcing circuit 12 connected between VDD and one end of a load L1 and a current sinking circuit 14 connected between the other end of load L1 and ground.

The current sourcing circuit 12 includes a current sensing resistor R1 connected in series with the conduction paths of insulated-gate field effect transistors (IGFETs) PA and NCA between VDD and an output terminal 13, to supply a load current into terminal 13 (also denoted as BPLUS). A fixed bias voltage (PBIAS) is applied to the gate of PA whereby PA functions as a constant current source. A control signal (TRI-STATE CONTROL) is applied to the gate of NCA to selectively turn it on or off. The current sinking circuit 14 includes a current sensing resistor R2 connected in series with the conduction paths of IGFETs NB and NCB between an output terminal 15 (also denoted as BMINUS) and ground. A fixed bias voltage (NBIAS) is applied to the gate of NB whereby NB functions as a constant current generator (sink), and the TRI-STATE CONTROL signal is applied to the gate of NCB to selectively turn it on or off.

The bias voltages applied to the gates of PA and NB ensure that the same amplitude current flows into the load at the BPLUS terminal and out of the load at the BMINUS terminal. A tri-state control signal applied to the gates of transistors NCA and NCB turns them both on or off at the same time. The circuit of FIG. 1 can supply (i.e. source) a current into the load which matches the current drawn (i.e. sunk) from the load.

However, the circuit of FIG. 1 does not have a high degree of power supply isolation. Power supply isolation as defined and used herein requires that there be no conduction (other than leakage) via the current sourcing and sinking circuits to VDD and/or ground when the current sourcing and sinking circuits are turned-off (i.e. disabled). Particularly, there should be no conduction via the turned-off current sourcing and sinking circuits when positive or negative signals are present at the output terminals 13 and 15 (due, for example, to inductive kicks from the load).

The lack of power supply isolation is best explained by reference to FIG. 1B which is a drawing of FIG. 1A showing parasitic and junction diodes associated with the switching and current setting transistors. For purpose of illustration, FIG. 1B shows the source-to-substrate and drain-to-substrate diodes associated with each one of the IGFETs. Consider the case where NB and NCB and PA and NCA are turned-off and a negative potential is produced at output terminals 13 and/or 15. When a signal at output terminals 13 and/or 15 goes negative with respect to ground by more than the forward voltage drop of a diode (i.e., 0.5 to 0.7 volt), diode D1NCB, which represents the subtstrate-to-drain junction of NCB, becomes forward biased and provides a conduction path between ground and the output terminals 13 and 15. Similarly, diode D2NCA which represents the substrate-to-source junction of NCA, becomes forward biased and provides a conduction path between ground and output terminals 13 and 15.

Note that if NCA were replaced by an IGFET of P conductivity type, a parasitic diode would be included as part of the IGFET which would still provide a conduction path for positive going signals at the output terminals. Therefore, the problem with a lack of power supply isolation would still exist.

In theory, diodes could be connected in series between the current source and current sink circuits and load terminals 13 and 15, respectively. However, these series diodes would cause a voltage drop which is generally very undesirable because it limits the output voltage range. In addition, the series diodes could lead to the formation of parasitic bipolar transistors which would introduce undesirable conduction paths.

It is desirable to have a current sourcing or sinking circuit with a high degree of power supply isolation. That is, a current sourcing or sinking circuit in which there is no conduction between the output terminals of the circuit and the power supply lines when the current sourcing and sinking circuits are turned off.

SUMMARY OF THE INVENTION

The problem present in the prior art circuit is overcome in circuitry embodying the invention by including, in each one of the current sink and current source circuits, a bipolar switching transistor connected in series with an IGFET biased to conduct a constant current. Furthermore, circuits embodying the invention include means for compensating for the base current of the bipolar transistors in the source and sink circuits to produce output currents which are matched.

BRIEF DESCRIPTION OF THE DRAWING

In the accompanying drawing, like reference characters denote like components; and FIG. 1A is a schematic diagram of a prior art load driver;

FIG. 1B is a schematic diagram of the prior art circuit of FIG. 1 showing parasitic diodes;

FIGS. 3a, 3b and 4 are cross section diagrams of bipolar transistors which may be used to practice the invention.

DETAILED DESCRIPTION OF THE INVENTION

Figure 2:
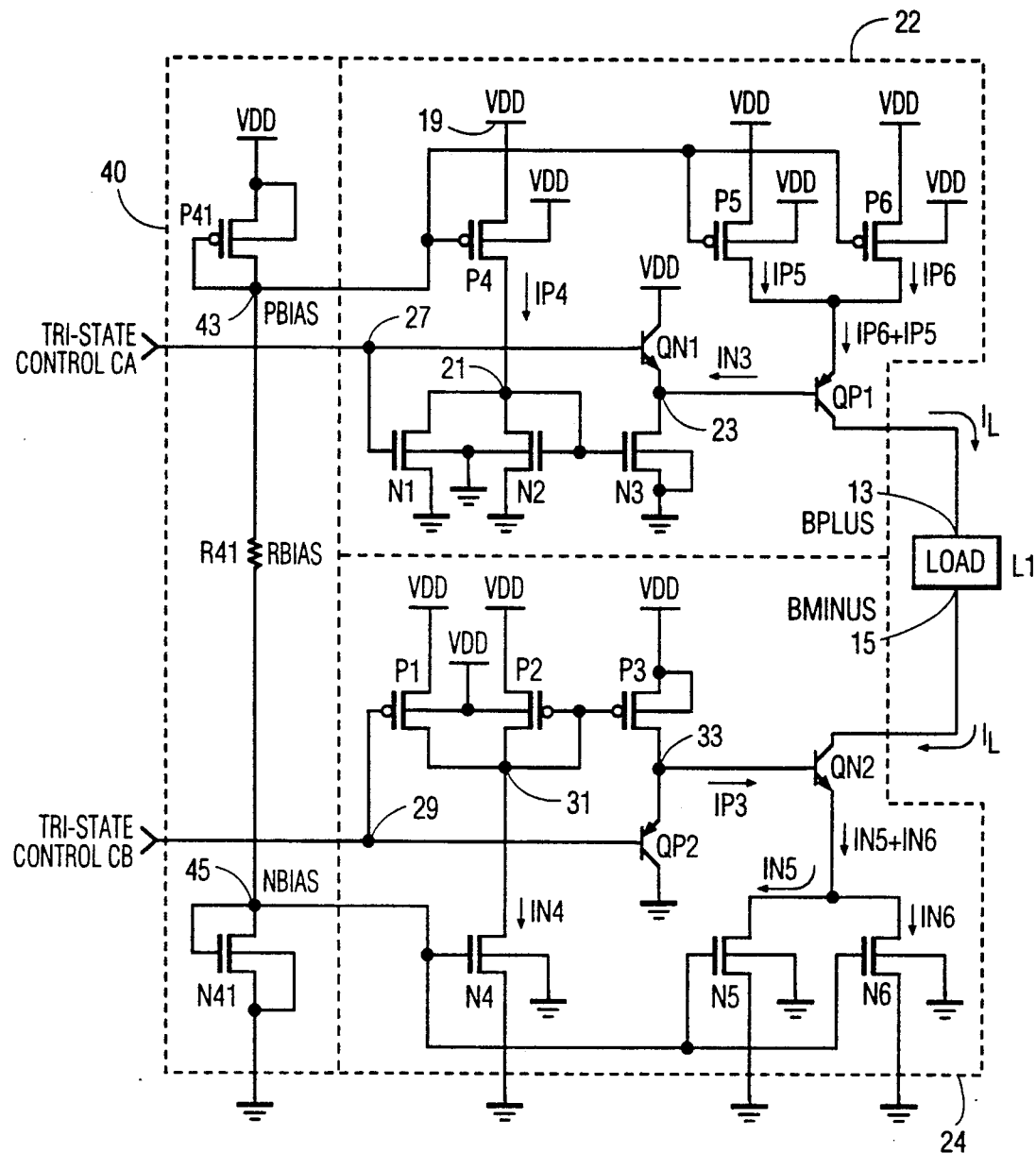
FIG. 2 is a schematic diagram of a current driver circuit employing bipolar and insulated-gate transistors embodying the invention.

The circuit of FIG. 2 includes a load L1 connected between terminal 13 (also denoted as BPLUS) and terminal 15 (also denoted as BMINUS). The load L1 may be, for example, a motor exhibiting some resistance and inductance or any one of a number of load devices through which a current must pass for proper operation. A current sourcing circuit 22 supplies a load current (IL) into load L1 at terminal 13 and a current sinking circuit 24, connected to terminal 15, draws the load current, IL, out of terminal 15.

The current sourcing circuit 22 includes IGFETS P5 and P6 having their conduction paths connected in parallel between power terminal 19, to which is applied a voltage of VDD volts, which is positive with respect to ground, and the emitter of a bipolar transistor, QP1. The collector of QP1 is connected to output terminal 13 and its base is connected to the emitter of an NPN bipolar transistor QN1 and to the drain of an IGFET N3, whose source is grounded. The conduction path of an IGFET P4 is connected between terminal 19 and a node 21 to which is connected the drains of IGFETs N1 and N2 whose source electrodes are grounded. The gates of N2 and N3 are connected to the drain of N2 at node 21 whereby the current in the conduction path of N2 is mirrored in the conduction path of N3. The gate of N1 and the base of QN1 are connected in common to tri-state control terminal 27 to which is applied a control signal CA. When CA is high, N1 and QN1 are turned on and the current sourcing circuit 22 is disabled. When control signal CA is low N1 and QN1 are turned off and the current sourcing circuit 22 is enabled.

The same bias voltage (PBIAS) is applied to the gates of P4, P5 and P6. Assume that P4 and P5 are made the same size and that P6 is ratioed to be "N" times the size of P4 or P5. By making P4 and P5 the same size and by making them using the same process, the current through P5 will be the same as the current through P4. Where P6 is "N" times the size of P4 the current (IP6) through P6 will be "N" times the current (IP4) through P4.

The current sinking circuit 24 includes IGFETS N5 and N6 having their conduction paths connected in parallel between ground terminal and the emitter of a bipolar transistor, QN2. The collector of QN2 is connected to output terminal 15 and its base is connected at node 33 to the emitter of a PNP bipolar transistor QP2 and to the drain of an IGFET P3, whose source is connected to terminal 19. The conduction path of an IGFET N4 is connected between ground terminal and a node 31 to which is connected the drains of IGFETs P1 and P2 whose source electrodes are connected to terminal 19. The gates of P2 and P3 are connected to the drain of P2 at node 31 whereby the current in the conduction path of P2 is mirrored in the conduction path of P3. The gate of P1 and the base of QP2 are connected in common to tri-state control terminal 29 to which is applied a control signal CB, which is the complement of CA. When CB is high, P1 and QP2 are turned off and the curent sinking circuit 24 is enabled. When control signal CB is low P1 and QP2 are turned on and the current sinking circuit 24 is disabled.

The same bias voltage (NBIAS) is applied to the gates of N4, N5 and N6. Assume that N4 and N5 are made the same size and that N6 is ratioed to be "N" times the size of N4 or N5. By making N4 and N5 the same size and by making them using the same process, current (IN5) through N5 will be the same as the current (IN4) through N4. Where N6 is "N" times the size of N4 the current (IN6) through N6 will be "N" times the current through N4.

PBIAS and NBIAS are generated by means of network 40 which includes P-type IGFET P41 and N-type IGFET N41 and a current limiting resistor R41. P41 is connected at its source to terminal 19 and its gate and drain are connected in common to PBIAS TERMINAL 43. Resistor R41 is connected between terminal 43 and NBIAS terminal 45. The gate and drain of N41 are connected to terminal 45 and the source of N41 is connected to ground. It is evident that the same amplitude current flows through P41 and N41 and establishes the bias voltage levels at the PBIAS and NBIAS terminals. PBIAS is applied to the gates of P4, P5, and P6 whose sources are connected to terminal 19, as is the source of P41. Hence, the current through P41 is mirrored in P4, P5, and P6. In a similar manner, NBIAS is applied to the gates of N4, N5, and N6 whose sources are grounded as is the source of N41. Hence, the current through N41 is mirrored in N4, N5, and N6.

The operation of the circuit of FIG. 2 will now be discussed. Note first that PBIAS applied to the gate of P4, P5 and P6 causes currents IP4, IP5, and IP6 to flow through P4, P5 and P6, respectively. Although P41 need not be the same size as P4 or P5, assume for ease of description that P4 and P5 are the same size as P41 and that P6 is N times P41. For these assumptions IP4 and IP5 will equal IP41 and IP6 will be N times IP41. In a similar manner, NBIAS applied to the gates of N4, N5, and N6 causes currents IN4, IN5 and IN6 to flow through N4, N5, and N6, respectively. Although N41 need not be the same size as N4 and N5, assume for ease of description that N4 and N5 are the same size as N41 and that N6 is N times the size of N41. For these assumptions IN4 is equal to IN5 and IN6 is "N" times IN41.

For the condition when CA is low and CB is high, QP1 and QN2 are turned on. A load current IL is supplied to terminal 13 (BPLUS) via current sourcing circuit 22 and a like current is drawn from terminal 15 (BMINUS) via current sinking circuit 24. When CA is low, transistors QN1 and N1 are turned off. When N1 is turned off the current IP4 through P4 flows through the conduction path of N2. The current IN2 through the source-drain path of N2 is mirrored in N3 causing a current IN3 to flow in the drain-to-source path of N3. For the assumptions of N1 equal to N2 and N3, IN3 is equal to IN2 which is equal to IP4. When QN1 is off the current IN3 is drawn out of the base of QP1.

Concurrently, the current into the emitter of QP1 is supplied via P5 and P6. Where P5 and P4 are identical in size and structure, and made by the same process, and where the same voltage is applied between their source and gate electrodes, the current IP5 flowing through the source-drain path of P5 is equal to the current, IP4, flowing through the source-drain path of P4. Concurrently, where P6 is "N" times the size of P5, P4 or P41, the current, IP6, through the source-drain path of P6 is equal to N times IP4 since P6 is N times the size of P4 and P4 and to have the same gate-to-source potential. Thus the emitter current of QP1 is IP5 plus IP6. Since the current drawn out of the base of QP1 is IP4 which is equal to IP5, the net current flowing out of the collector of QP1 into the load is IP6 also denoted herein as IL.

Concurrently, when CB is high, P1 and QP2 are turned-off. When P1 is turned off, the current IN4 flowing through the source-drain path of N4 flows through the source-drain path of P2 whereby the current through the source-to-drain path of P2 is equal to IN4. The current, IP2, is mirrored in the source-to-drain path of P3. Where P3 is the same size as P2 and they are biased in an identical manner, the current IP3 very nearly equals IP2. Since QP2 is turned-off, the current IP3, flowing out of the drain of P3, flows into the base of QN2 causing QN2 to conduct a collector current IL out of termninal 15. The emitter current of QN2 flows via N5 and N6 to ground. The current IN5 through N5 is equal to the current IN4 through N4 where N4 and N5 are the same size and are made by the same process and have the same gate-to-source potential. Since IN4 is also equal to IP3, The current IP3 into the base of QN2 is equal to the current IN5 drawn out of the emitter of QN2. Thus with CB high and P1 turned-off, the current IN4 flows through P2, whereby IP2 is equal to IN4. The current through P2 is mirrored into P3. Where P2 and P3 are the same size and made by the same process and have like gate to source potentials, IP3 flowing into the base of QN2 is equal to the current IN5 drawn out of the emitter of QN2. The remaining current drawn out of the emitter of QN2 is equal to the current (IN6) flowing through the source-to-drain path of N6. The current flowing through IN6 is essentially equal to the current IP6 flowing through P6 and the load connected between the collectors of QP1 and QN2.

Thus, any current imbalance due to the base currents of QP1 and QN2 has been eliminated.

Bipolar transistors QP1 and QN2 may be formed as shown in cross section in FIGS. 3A an 3B. QP1 and QN2 of FIGS. 3A and 3B are lateral bipolar transistors which are designed to provide power supply isolation by preventing unwanted conduction paths as outlined below.

For ease of description, FIGS. 3A and 3B show some of the parasitic diodes superimposed on the cross sectional diagram. Referring to FIG. 3A, there is shown a diode D1 formed between the emitter of QP1 and the N-Well which defines the base region of QP1 with the P+ emitter region defining the anode of D1 and the N-Well region defining the cathode of D1. A diode D2 is formed between the PBODY region and the N-Well of QP1, with the P body collector region defining the anode and the N-Well defining the cathode of D2. A diode D6 is formed between the N+ buried layer and the P-substrate in which QP1 is formed, with the N+ buried layer defining the cathode of D6 and the P-sustrate defining the anode of D6. The N-Well to N+ buried layer are at the same potential with the N-Well defining the base region of QP1 and the N+ buried layer (SINKER) defining the base contact of QP1.

Referring to FIG. 3B, there is shown a diode D3 formed between the N body collector region and the P-Well, which defines the base region of QN2, with the N body collector region defining the cathode and the P-Well region the anode of D3. A diode D4 is formed between the N+ emitter and the P-Well, with the N+ emitter defining the cathode and the P-Well the anode of D4. A diode D4A is formed between the P-Well and the N+ buried layer (SINKER) which is also common to the emitter of QN2, with the P-Well defining the anode and the N+ buried layer the cathode of D4A. Finally, a diode D5 is formed between the N+ buried layer and the P-Substrate in which QN2 is formed with the N+ buried layer defining the cathode and the P-Substrate the anode of D5.

Figure 4:
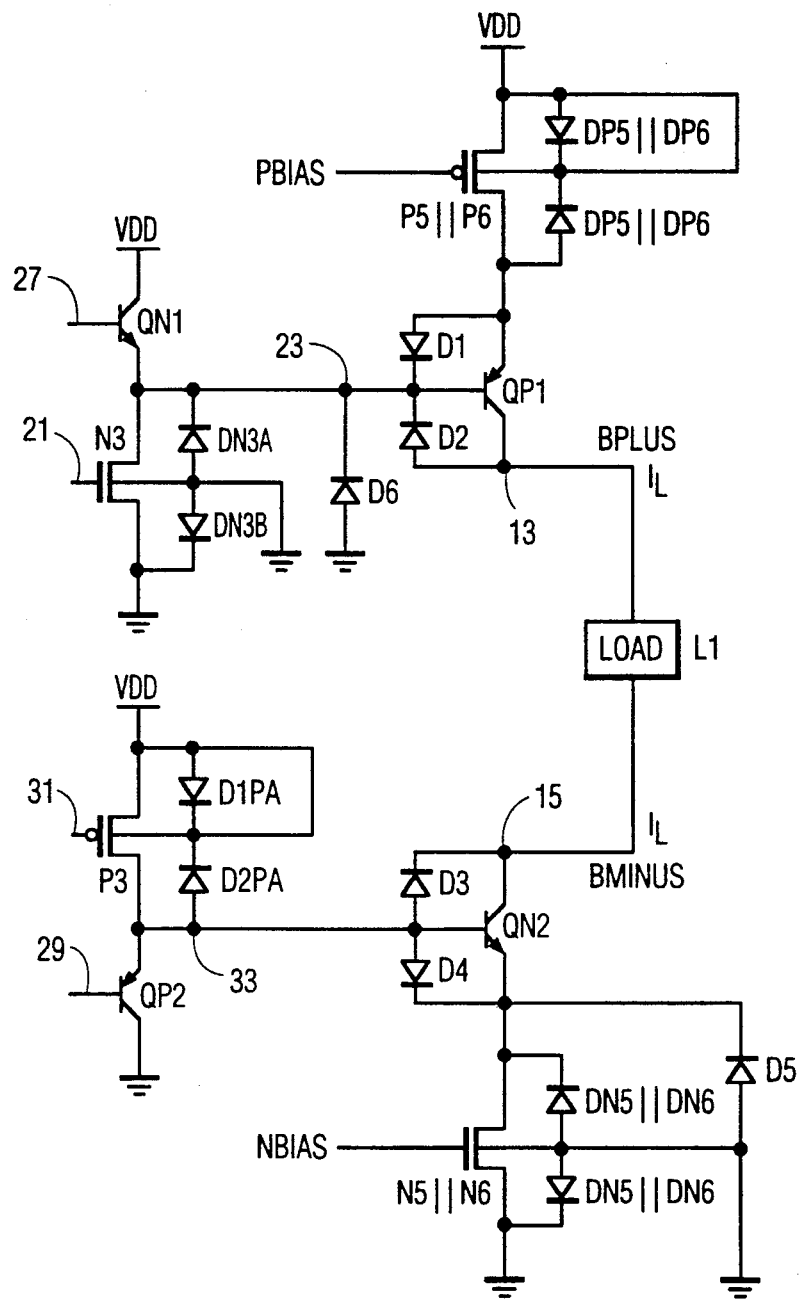

The parasitic diodes associated with QP1 and QN2 as shown in FIGS. 3A and 3B and the parasitic diodes associated with some of the IGFETs in the output stage of FIG. 2, have been combined with the transistors to produce a simplified composite output stage shown in FIG. 4. Referring to FIG. 4, diodes D1 and D2 represent the emitter-to-base and collector-to-base diodes, respectively, of QP1. Diodes D3 and D4 represent the collector-to-base and base-to-emitter diodes, respectively, of QN2. When the voltage V13 at the output terminal 13 goes negative with respect to ground, diode D2 is reversed biased and blocks the signal from being coupled to the internal nodes of the circuit. Whe V13 goes positive by more than the forward voltage drop (Vf) of a diode, D2 conducts the positive signal to the base of QP1, which is also common to node 23. However, the other diodes (D1, D2, DN3A and the base-to-emitter of QN1) connected to node 23 have their cathodes connected to node 23 whereby they are reverse biased and non-conducting and block the positive signal from affecting the operation of the circuit.

When the voltage (V15) at output terminal 15 goes negative by more than the forward voltage drop (Vf) of a diode, diode D3 conducts and passes the negative signal to the base of QN2 which is also common to node 33. However, the other diodes (D4, D2P4 and the emitter-to-base of QP2) connected to node 33 have their anodes connected to node 33 whereby they are reverse biased and non-conducting and block the negative signal at node 33 from affecting the circuit.

When V15 goes positive, diode D3 blocks the positive V15 signal from being coupled to the internal nodes of the circuit.

Hence it has been shown that the circuit of FIG. 4, which represents the output stage of FIG. 2 and incorporates the parasitic diodes of the transistors in the output stage, provides a high degree of power supply isolation.

What is claimed is:

1. The combination comprising:
   a first bipolar transistor having an emitter, a base, and a collector;
   current conducting means for passing first and second currents in parallel between a first point of operating potential and the emitter of said first bipolar transistor;
   means coupled to the base of said first bipolar transistor for conducting a base current whose amplitude is essentially equal to said first current and poled in a direction to turn on the first bipolar transistor for producing a current in the collector of said first transistor which is essentially equal to said second current.

2. The combination as claimed in claim 1, wherein said current conducting means for passing first and second currents in parallel includes first and second insulated-gate field-effect transistors (IGFETs), each IGFET having source and drain electrodes defining the ends of a conduction path and a gate; and
   wherein the conduction paths of said first and second IGFETs ar connected in parallel between said first point of operating potential and the emitter of said first bipolar transistor.

3. The combination as claimed in claim 2, wherein said means coupled to the base of said first bipolar transistor includes a third IGFET having its conduction path connected between the base of said first bipolar transistor and a second point of operating potential.

4. The combination as claimed in claim 3, wherein said current conducting means for passing said first and second currents and said means for conducting a base current include additional fourth and fifth IGFETs, the conduction paths of said fourth and fifth IGFETs being connected in series between first and second points of operating potential whereby the same current flows through their conduction paths;
   wherein the same bias potential is applied to said fourth IGFET as is applied to said first and second IGFETs; and
   wherein the gate and drain of said fifth IGFET are connected to the gate of said third IGFET and the source of the fifth IGFET is connected to the source of the third IGFET, whereby the current in said fifth IGFET is mirrored in the conduction path of said third IGFET.

5. The combination as claimed in claim 4, wherein said first, second and fourth IGFETs are of the same conductivity type; and wherein the size of said first IGFET is M times that of said fourth IGFET and the size of said second IGFET is N times that of said fourth IGFET; and wherein said fifth IGFET is of the same conductivity as said third IGFET and the size of said third IGFET is M times the size of said fifth IGFET.

6. The combination as claimed in claim 5,
wherein first, second and fourth IGFETs are of first conductivity type;
wherein said first bipolar transistor is of like conductivity type; and wherein said third and fifth IGFETs are of complementary conductivity type to said first conductivity type.

7. The combination comprising:
first and second power terminals for the application therebetween of an operating potential;
first and second output terminals for the connection therebetween of a load;
first means connecting the conduction paths of a first insulated gate field-effect transistor (IGFET) and a first bipolar transistor in series between said first power terminal and said first output terminal for supplying a current into said first output terminal;
second means connecting the conduction paths of a second IGFET and a second bipolar transistor in series between said second output terminal and said second power terminal for sinking a current out of said second output terminal having the same amplitude as the current supplied to said first output terminal.

8. The combination as claimed in claim 7, wherein said first means includes a third IGFET having its conduction path connected betwen said first power terminal and the emitter of said first bipolar transistor and a fourth IGFET having its conduction path connected between the base of said first bipolar transistor and said second point of operating potential, said fourth IGFET for passing the base current of said first bipolar transistor and said third IGFET for passing a current between said first terminal and said emitter of said first bipolar transistor which is equal to the base current of said first bipolar transistor.

9. The combination as claimed in claim 8, wherein said second means includes a fifth IGFET having its conduction path connected between said first power terminal and the base of said second bipolar transistor for supplying a base current to said second bipolar transistor and a sixth IGFET having its conduction path connected between the emitter of said second bipolar transistor and said second power terminal for conducting a current equal to said base current between the emitter of said second bipolar transistor and said second power terminal.

10. The combination as claimed in claim 7, wherein said first means includes means for biasing said first and second IGFETs for causing substantially the same current to flow in their conduction paths and means for applying signals to the bases of said first and second bipolar transistors for selectively turning them both on at the same time or off at the same time.

11. The combination comprising:
first and second power terminals for the application therebetween of an operating potential;
first and second output terminals for the connection therebetween of a load;
first and second insulated-gate field-effect transistors (IGFETS) of first and second conductivity, respectively, each IGFET having source and drain electrodes defining the ends of a conduction path and a control electrode overlying the conduction path;
first and second lateral bipolar transistors of first and second conductivity type, respectively, each bipolar transistor having emitter and collector electrodes defining a main conduction path and a base electrode;
first means connecting the conduction path of said first IGFET between said first power terminal and the emitter of said first lateral bipolar transistor and the collector of said first lateral bipolar transistor to said first output terminal; and
second means connecting the conduction path of said second IGFET between said second power terminal and the emitter of said second lateral bipolar transistor and means connecting the collector of said second bipolar transistor to said second output terminal.

* * * * *